United States Patent [19]

Goldberg et al.

[11] Patent Number: 4,686,485

[45] Date of Patent: Aug. 11, 1987

[54] OPTICAL INJECTION LOCKING OF LASER DIODE ARRAYS

[75] Inventors: Lew Goldberg; Henry F. Taylor, both of Alexandria, Va.; Joseph F. Weller, Fort Washington, Md.

[73] Assignee: The United States of America as represented by the Secretary of the Navy, Washington, D.C.

[21] Appl. No.: 795,796

[22] Filed: Nov. 7, 1985

[51] Int. Cl.$^4$ ................................................. H01S 3/00
[52] U.S. Cl. ........................................ 330/4.3; 372/18; 372/19
[58] Field of Search ................... 330/4.3; 372/18, 19, 372/50, 44

[56] References Cited

U.S. PATENT DOCUMENTS

| | | | |
|---|---|---|---|
| 3,704,427 | 11/1972 | Heywang | 372/44 |
| 4,264,870 | 4/1981 | Avicola et al. | 330/4.3 |
| 4,446,557 | 5/1984 | Figueroa | 372/45 |
| 4,455,657 | 6/1984 | Byer | 372/18 |
| 4,468,776 | 8/1984 | McLellan | 372/93 |

OTHER PUBLICATIONS

"High Power Phase-Locked Arrays of Index-Guided Diode Lasers", D. Botez and J. C. Connolly; Appl. Phys Lett 43(12), Dec. 15, 1983.
"Phase Locking of Lasers by an Injected Signal", Weng W. Chow; Sep. 1982, vol. 7, No. 9, Institute for Modern Optics.

*Primary Examiner*—James W. Davie
*Assistant Examiner*—Bertha R. Randolph
*Attorney, Agent, or Firm*—John L. Forrest; Ansel M. Schwartz

[57] ABSTRACT

An apparatus for amplifying a laser beam through injection locking of a laser array by a single master laser is presented. The apparatus is comprised of a master laser which produces a beam that is shaped or focused onto a laser array facet which is further comprised of an array junction plane wherein the laser array is biased above threshold.

8 Claims, 10 Drawing Figures

FAR FIELD SPECTRAL INTENSITY DISTRIBUTION

OPTICAL INJECTION LOCKING OF LASER DIODE ARRAYS

BACKGROUND OF THE INVENTION

The present invention relates to optical injection locking. More specifically the present invention relates to optical injection locking of a laser array to increase the power of a laser beam.

The generation of continuous, high optical output power from semiconductor lasers operating at room temperature is of great interest. For example, in the field of signal processing, a powerful laser beam is necessary for light to pass through an optical fiber having a length on the order of optical fibers lengths used in the telecommunication industry.

One approach that has succeeded in obtaining over a watt of output power per laser mirror facet is to coherently combine the power of many lasers operating on the same chip. Phase coupling of adjacent lasers is achieved by distributed coupling among the lasers of the array. (See "Experimental and Analytic studies of coupled stripe diode lasers", D. R. Scifres, W. Streifer, R. D. Burnham, IEEE J. Quantum Electron, Vol. QE-15, p. 917-922, Sept. 1979 for a full discussion of the design and construction of laser arrays.) Although some devices have exhibited single spectral mode and single far-field lobe emission, they are unpredictable. In general, the array outputs have been multimoded and double lobed. This can be understood by refernece to FIG. 1 which is a schematic representation of the spatial and spectral output of a laser array. Lines 10 represent the ends of several electrode stripes that comprise the laser array. In front of each stripe the intensity of light is greater than the areas between stripes. This is represented by pseudo-graph 12 which shows line 14 that represents the intensity of light as a function of position relative to base line 16 at the array facet. Note how the peaks of intensity 14a occur in front of the stripes 10.

The phase of the light emitted by the array is shown in pseudo-graph 18 of FIG. 1, which is a plot of the phase of the light as a function of position (line 20) relative to zero (line 22). As can be seen from line 20, the phase of the light as a function of position varies. The phase can have positive or negative values depending on position. The result is a far field intensity distribution, see FIG. 2a, that is multi-lobed. The far-field intensity distribution is the diffraction pattern of the optical field distribution at the array facet (see "Experimental and Analytic studies of coupled stripe diode lasers", D. R. Scifres, W. Streifer, R. D. Burnham, IEEE J. Quantum Electron, Vol. QE-15, p. 917-922, Sept. 1979). FIG. 2a is a graph of the far-field intensity of light as a function of far field angle. Peaks 30 and 32 are two unique and distinct lobes. By having two or more broad far-field lobes the laser light can not be collimated or focused, thus making it very difficult to transmit the light through an optical fiber, since the light cannot be focused to a small point that is required to feed the light into the fiber. Also, the array output spectral intensity distribution is multi-moded, See FIG. 2b. This is caused by random phase fluctuations in the light emitted by the array, see FIG. 1. This makes it impossible to transmit large bandwidths along the fiber since each mode propagates through the fiber at a different velocity resulting in different parts of a signal arriving at a destination point at different times. Deciphering the signal correctly would for all practical purposes be impossible. Furthermore, none of the uniform array structures reported thus far have operated in both a single spectral mode and a single far-field lobe.

The control of the phase and frequency of one discrete laser by another discrete laser by optical injection locking has been demonstrated and used for phase control, wavelength stability, microwave generation using FM sideband locking of the master laser, and locking together of multiple lasers. But in most of these cases, the laser diode being locked had a single spectral mode and a single lobe output, but being a discrete device, had only modest power of less than 10 mW.

It has been shown in "Chirped Arrays of Diode Lasers for Supermode Control", E. Kapon C. Lindsey, J. Katz, S. Margalit, and A. Yariv Appl. Phys. Lett. Vol 45 (30) Aug. 1, 1984, pgs 200-202; and "Phase Locked Injection Laser Arrays With Nonuniform Stripe Spacing", by D.E. Ackley Electron. Lett., Vol. 20, No. 17, Aug. 16, 1984, pgs. 695-697 Sthat single lobe operation can be accomplished by designing the array with nonuniform spacing between the lasing stripes. That alters the coupling between adjacent stripes and by proper design the coupling coefficients can be selected to produce array modes whose amplitude closely match the available gain profile of the laser structure. In this way, a single lobe spatial output can be obtained. But that technique does not assure single spectral mode operation, especially over all output levels of the diode array.

SUMMARY OF THE INVENTION

Accordingly, one object of this invention is to provide a novel system to control the spectral and spatial output of a laser diode array.

Another object of this invention is to provide a novel system which amplifies the power of a laser beam.

Another object of this invention is to provide a novel system which amplifies the power of a laser beam while maintaining a single spectral mode and a single spatial mode in the far field.

These and other objects of the present invention are achieved with an apparatus for amplifying a laser beam comprising: a master laser that produces a laser beam; a laser array having an array facet and an array junction plane on the array facet; and means for shaping or focusing the laser beam produced by the master laser so that the laser beam irradiates the array junction plane causing the laser array to be injection locked.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
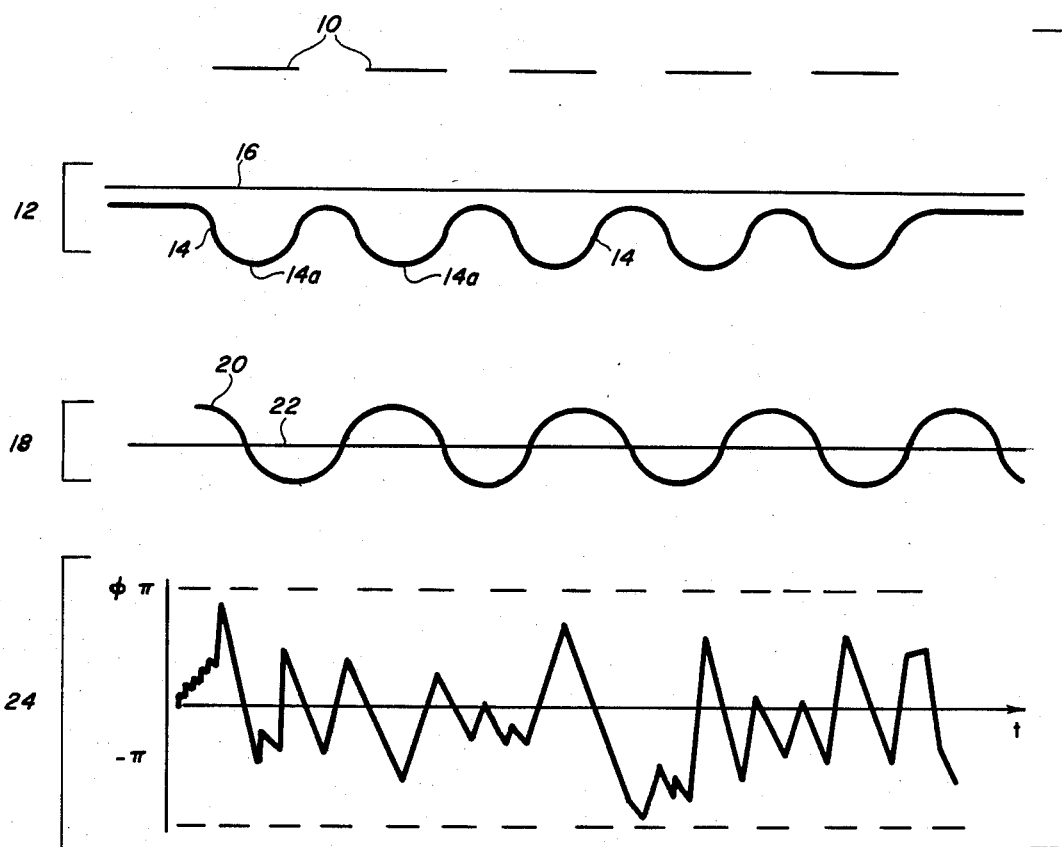
FIG. 1 is a schematic representation of the spatial and spectral output of a free-running laser array at the array facet.
Figure 2A:
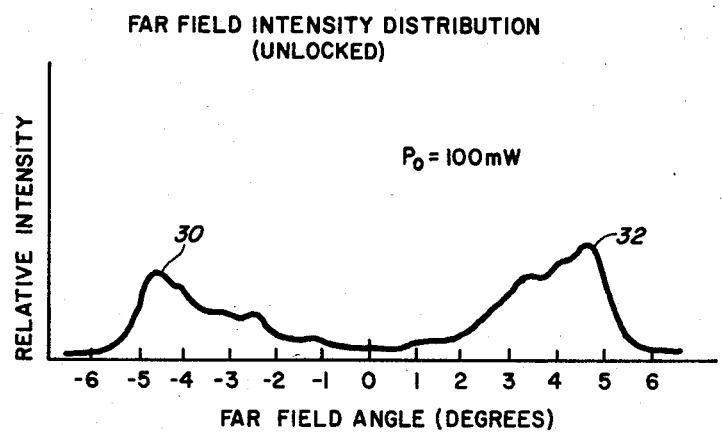
FIGS. 2(a) and 2(b) represent the far field intensity distribution and spectral output of a free-running (unlocked) laser array.
Figure 2B:
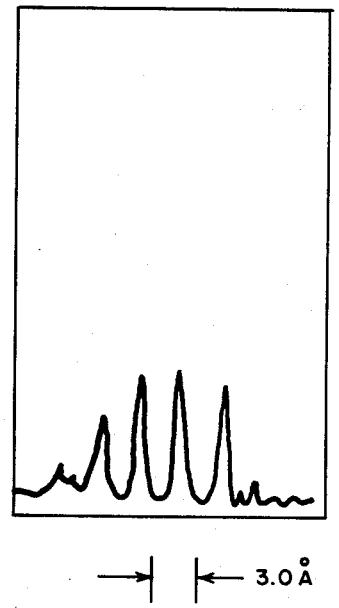
Figure 3:
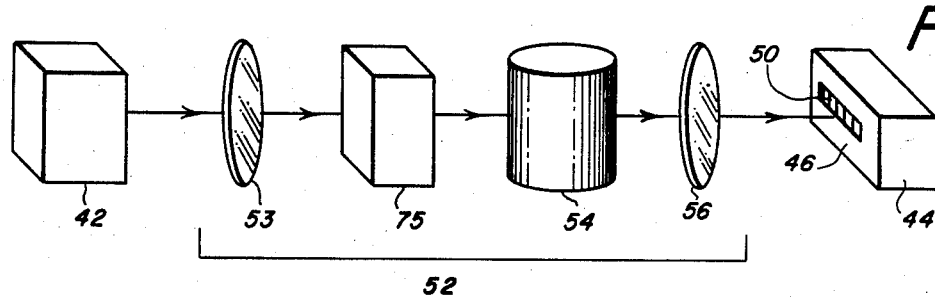
FIG. 3 is a schematic representation of an apparatus for injection locking a laser array.

Referring now to the drawings, wherein like reference numerals designate identical or corresponding parts throughout the several views, there is shown in FIG. 3 an apparatus for amplifying a laser beam 40. The apparatus shown in FIG. 3 is comprised of a single stripe master laser 42 that produces the laser beam represented by a single line with a series of arrowheads, a laser array 44 having a facet 46 and a junction plane (not numbered) where the ends 50 of stripes are exposed, and a means 52 for shaping and focusing the laser beam so the edge of the laser beam irradiates the junction plane causing the laser array 44 to be injection locked. (A faraday rotator 75 polarizes the beam and prevents this output of array 44 from irradiating the master laser 42.) In the injection locked condition the array spectrum and far field intensity distribution are controlled by the master laser 42. The output of the injection locked laser array 44 has a single spatial mode and a single spectral mode with output powers up to 100 mW and above. Furthermore, the output of the array 44 has a spectral linewidth equal to that of the master laser 42. Since the master laser 42 has a linewidth which is much smaller than that of the uninjected array, the linewidth of the injection locked array 44 thus is considerably less than the free running laser 42.

Figure 4:
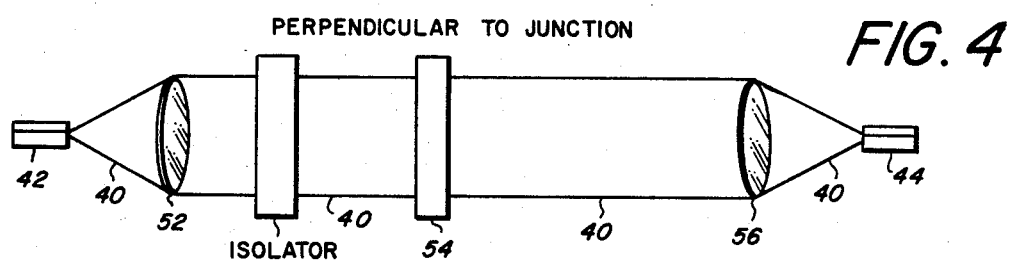
FIG. 4 is a perpendicular-to-junction view of the laser array injection locking apparatus.
Figure 5:
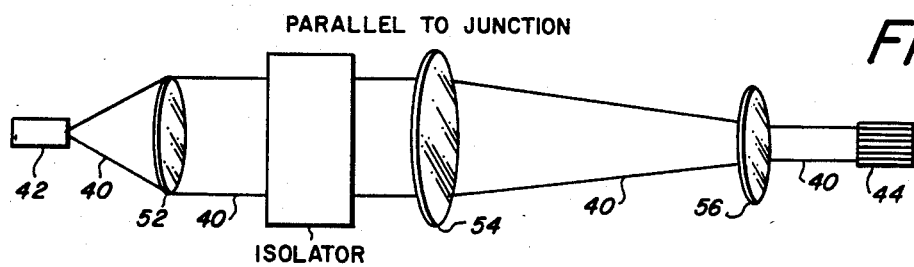
FIG. 5 is a parallel-to-junction view of the laser array injection locking apparatus.
Figure 8:
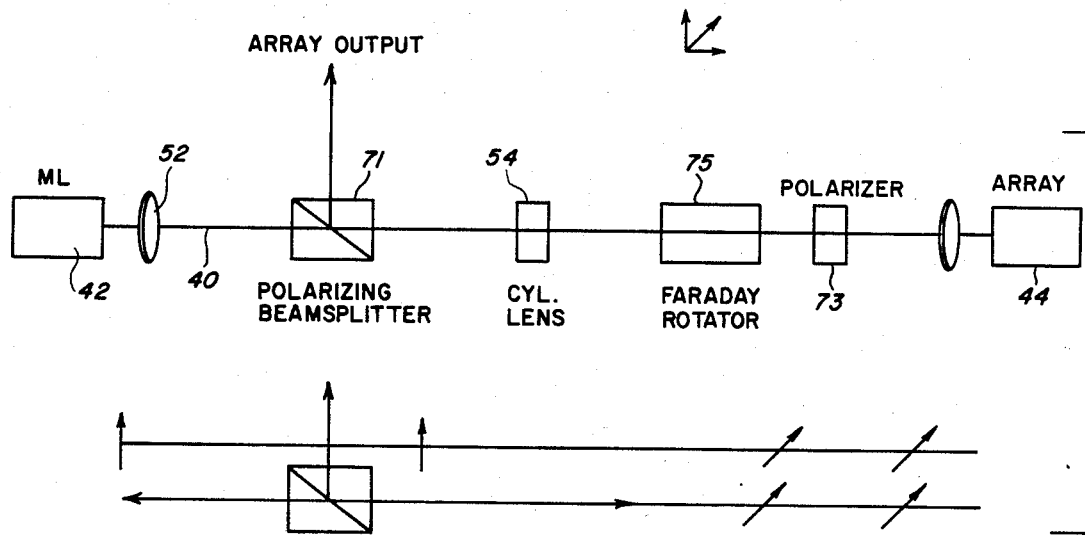
FIG. 8 is a schematic diagram of a preferred embodiment of the invention.

Injection locking of the array 44 is achieved by irradiating the junction plane with the laser beam, labelled 40 in FIGS. 4, 5 and 8, produced by the master laser 42. The incident beam 40 must be narrow in one direction and wide in the other to approximate the shape of the junction plane on the edge of the array facet and focused thereon. A series of lenses 52, shown in FIG. 3 and represented in FIGS. 4, 5 an 8 by a single lens 52, is used for shaping the beam into the edge of the shape of the junction plane and for focusing the shaped beam 40 onto the edge of the junction plane. This is the essential feature to achieve injection locking and the placement of the master laser 42 and any lens used to achieve the correct shaping and focusing of the beam is of secondary importance. See "Injection Locking in AlGaAs Semiconductor Lasers", S. Kobayaski, T. Kimura, IEEE J. Quantum Electron, Vol. QE-17, pp. 681–683, May 1981, for a more detailed explanation of injection locking. The only exception to the statement that the placement of the lasers is of secondary importance is that in order to maximize the power contained in the single narrow lobe, the incident beam should be directed at an angle of about 4 degrees to the array facet normal. At high array output powers, single lobe operation of the injection locked array 44 occurs only with the injecting beam incident at angles of approximately 4 degrees to the facet normal.

One possible means to shape and focus the laser beam is comprised of a collimating lens 53 shown in FIG. 3, that collimates the outputted laser beam 40 from the master laser 42; a cylindrical lens 54 shown in FIG. 3, that narrows the collimated beam in the plane parallel to the array junction plane to approximately the length of the array junction plane (see FIG. 4 which is a side view of the laser amplifying apparatus), but leaves the collimated beam along the plane perpendicular to the junction unchanged (see FIG. 5 which a side view of the laser amplifying apparatus); and a focusing lens 56 shown in FIG. 3 which receives the shaped and collimated beam and focuses it onto the junction plane. After passing through the lens 53, 54, and 56; the beam has essentially the same length and height as the junction plane.

Figure 6A:
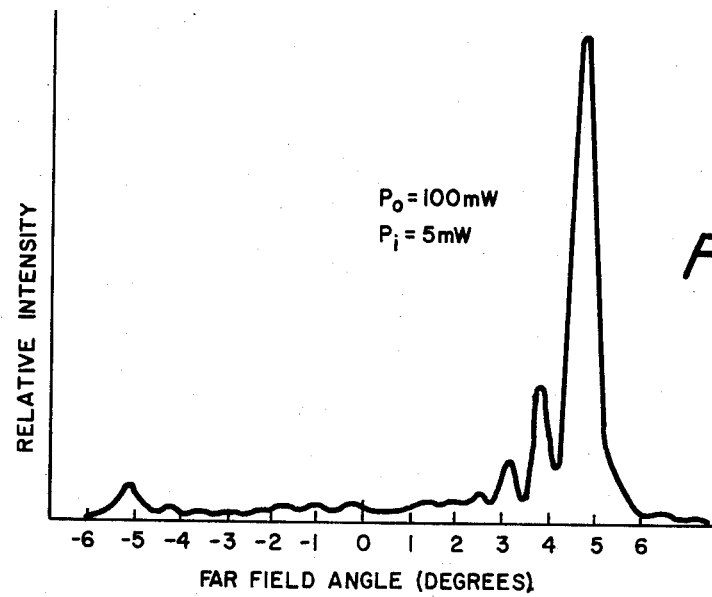
FIGS. 6(a) and 6(b) represent of the far field intensity distribution and the spectral output of an injection locked laser array.
Figure 6B:
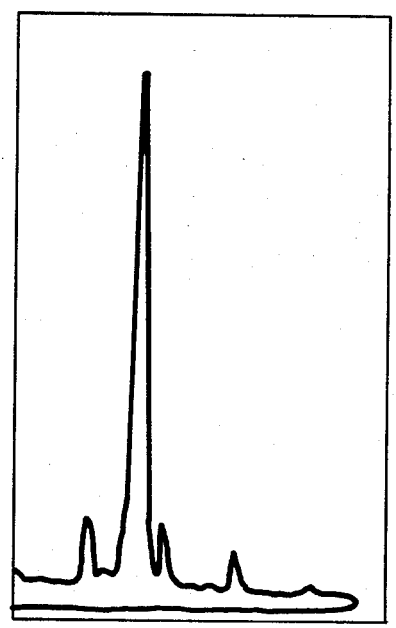
Figure 7:
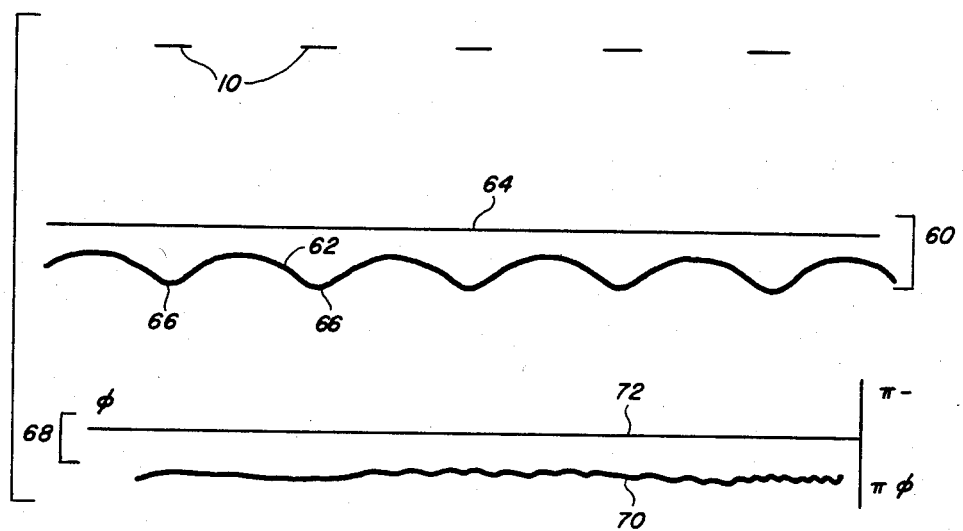
FIG. 7 is a schematic representation of the spatial and spectral output of an injection-locked laser array.

The injection locking of the array 44 causes the phase of light emitted by each stripe of the array 44 to be essentially in with every other stripe. Referring to FIG. 7, which is a schematic representation of the spatial output of an injection-locked laser array 44, pseudograph 60 shows the phase as a function of position (line 62) relative to the zero line 64. Note that the phase in front of all stripes has the same polarity and is almost constant. This is unlike the free-running array where the polarity of the phase at each stripe changed from one stripe to the next. As a result, the far field intensity distribution of an injection locked array is single lobed, see FIG. 6a. Moreover, in an injection locked array the phase of the light being emitted by the laser array as a function of time, is relatively constant. Pseudo-graph 68 in FIG. 7 shows the phase of the light (line 70) emitted by the array 44 as a function of time relative to a zero line 72. Note how the phase remains relatively constant as a function of time. The result is an array output, see FIG. 6, that is single-moded. FIG. 6a is a graph of the far-field intensity of light as a function of far field angle. By there being one far-field lobe, the light emitted by the array 44 is easily collimated or focused, thus enabling the light to be focused to a small point and be introduced into an optical fiber. Additionally, the spectral intensity distribution is single-moded, as shown in FIG. 6b, which is a graph of the spectral intensity distribution. By having an output spectral intensity distribution which is single-moded, it is possible to transmit large bandwidths along the fiber since a single mode will travel with the same velocity through a fiber. The large bandwidths are introduced into the system by modulating the array 44 or by using an external electrooptic modulator.

One embodiment of many possible embodiments of the invention is shown in FIG. 8 where a faraday rotator 75 and two polarizers 71, 73 which comprise a Faraday isolator are placed between the master laser 42 and the laser array 44 to allow light to flow only in the direction from the master laser 42 to the laser array 44 and not vice-versa due to the fact that the injecting beam 40 is incident on the front (output) facet 46. The polarizer 71 is a beamsplitter that allows the array output beam 40 to exit the optical system but lets the laser beam 40 from the master laser 42 to pass therethrough. The faraday rotator 75 changes the polarization of the laser beam 45° before it strikes the array 44. The output polarization of the array 44 is rotated an additional 45° when it passes through polarizer 73. Upon reaching polarizer 71 the array output beam is reflected out of the system by the polarizing beam splitter 71. The segments of the system are aligned accordingly. The master laser 42 is a GaAlAs CSP structure Hitachi HLP 1400 laser mounted on a thermoelectric cooler (not shown) for temperature control. A cylindrical lens 54 is used to produce at the array facet 46 (see FIG. 3) an injecting field spatial distribution which is less than 5 $\mu$m wide in the direction perpendicular to the array junction plane, and between 50 and 100 μm parallel to it. The injecting beam is incident on the front (output) facet 46 as shown in FIG. 3.

Injection locking is carried out by adjusting the array position and changing the master laser frequency until a desired far-field pattern is observed. The array is biased at 478 mA or 1.5 times threshold producing 105 mW of uninjected CW power. The master laser power incident on the lens 56 in front of the array 44 is 3.0 mW, with the actual power injected into the array 44, as determined by the lens coupling efficiency, estimated to be 10% to 20% of that value.

The far-field profile of the free running array, consists of two broad peaks separated by approximately 6.0 degrees. When injection locked, the far field changed to a single narrow lobe with a FWHM of 0.5 degrees, centered at 4.0 degrees away from the normal to the array facet. Under injection locking conditions described, the main lobe contains 60% to 70% of the total array output power. In order to maximize the power contained in the narrow lobe, the incident beam 40 has to be directed at an angle of about 4 degrees to the array facet normal. At high array output powers, single lobe operation of the injection locked array occurs only with the injecting beam incident at angles of approximately 4 degrees to the facet normal. Injection locking results in a single mode emission, with the main to next highest mode ratio of more than 200:1. The spectral width of the array 44 takes on the characteristics of the master laser 42, and its injection locked linewidth is less than 100 MHz. To obtain an injection locked, single lobe array output, the master laser frequency has to be tuned so that it is approximately 1.0 angstroms to the short wavelength side of the center frequency of one of the longitudinal modes of the free running array. Frequency turning of the master laser is accomplished by changing its temperature and/or current which changes the length and therefore the resonance frequency of the master laser optical resonator cavity. Although the position of the master laser 42 relative to the adjacent free running modes was critical, it was found that effective locking could be obtained with the master laser 42 considerably displaced from the peak of the gain spectrum. Single-mode spectra and narrow far-field lobes were obtained with the master laser 42 as far as 30 angstroms from the center of the array emission spectrum.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An apparatus for amplifying a laser beam comprising:
   a master laser that produces the laser beam;
   a laser array having an array facet containing the edge of a single array junction plane, said array being biased above threshold; and
   means for shaping and focusing the laser beam produced by the master laser so that the laser beam irradiates the edge of the single array junction plane causing the laser array to be injection locked.

2. An apparatus as described in claim 1 wherein the shaping and focusing means is comprised of a collimating lens that collimates the laser beam; a faraday isolator that isolates the master laser from the light emitted by the array; a cylindrical lens that narrows the laser beam along the plane parallel to the length of the array junction plane and a focusing lens that focuses the narrowed laser beam onto the edge of the junction plane.

3. A method for amplifying a laser beam comprising the steps of:
   producing a laser beam;
   collimating the laser beam;
   narrowing the laser beam along a plane parallel to an array junction plane of a laser array to a length equal to the length of the edge of the array junction plane of the laser array, the array being biased above threshold; and
   focusing the laser beam onto the edge of the junction plane of the array.

4. An apparatus as described in claim 1 wherein said facet incorporates laser diodes in close proximity to each other.

5. An apparatus for amplifying a laser beam comprising:
   a master laser that produces the laser beam;
   a laser array having an array facet containing the edge of a single junction plane; and
   means for shaping and focusing the laser beam produced by the master laser into a beam having a cross section that matches the edge of the junction plane so that the laser beam irradiates the edge of the array junction plane causing the laser array to be injection locked.

6. An apparatus as described in claim 5 wherein the shaping and focusing means is comprised of a collimating lens that collimates the laser beam; a faraday isolator that isolates the master laser from the light emitted by the array; a cylindrical lens that narrows the laser beam along the plane parallel to the length of the array junction plane and a focusing lens that focuses the narrowed beam onto the edge of the junction plane.

7. A method for amplifying a laser beam comprising the steps of:
   producing a laser beam;
   collimating the laser beam;
   narrowing the laser beam along a plane parallel to an array junction plane of a laser array to a length equal to the length of the edge of the array junction plane of the laser array thereby matching the beam's cross section to the length of the edge of the array junction plane; and
   focusing the laser beam onto the edge of the junction plane of the array.

8. The apparatus as described in claim 5 wherein said facet incorporates laser diodes in close proximity to each other.

* * * * *